Aug. 27, 1974 H. SOHLBRAND ET AL 3,832,232

PROCESS FOR PRODUCING CONTACT METAL LAYERS CONSISTING OF ALUMINUM ALLOY ON SEMICONDUCTOR COMPONENTS

Original Filed March 11, 1971

United States Patent Office 3,832,232
Patented Aug. 27, 1974

3,832,232
PROCESS FOR PRODUCING CONTACT METAL LAYERS CONSISTING OF ALUMINUM ALLOY ON SEMICONDUCTOR COMPONENTS

Heinrich Sohlbrand, Munich, Germany, assignor to Siemens Aktiengesellschaft, Erlangen and Berlin, Germany Continuation of abandoned application Ser. No. 123,186, Mar. 11, 1971. This application Feb. 26, 1973, Ser. No. 335,726
Claims priority, application Germany, Mar. 13, 1970, P 20 12 063.2
Int. Cl. H01l *1/14*
U.S. Cl. 117—227 9 Claims

ABSTRACT OF THE DISCLOSURE

A method of producing contact metal layers consisting of aluminum alloys on semiconductor components. The surface of the semiconductor body is provided with an organic varnish solution containing the metal compound. The latter is transferred by thermolysis into a pure metal layer. The appropriate metal alanate compounds are used for producing the aluminum containing alloy contacts. The method is particularly suited for producing titanium or silver containing aluminum contacts on semiconductor crystal surfaces.

This is a continuation of application Ser. No. 123,186, filed Mar. 11, 1971, now abandoned.

My invention relates to a method for producing a fast adhering, contactable metallization on surfaces of electric circuit components such as silicon planar semiconductor components, which comprises the steps of applying a solution containing the metal or a liquid suspension upon the surface to be metallized; evaporating the liquid and converting the remaining layer which contains the metal compound into a pure metal layer by heating and subsequently sintering or alloying the layer into the semiconductor surface.

One of the last production steps in a system for producing electrical components, more particularly microsemiconductor components, according to the planar or the mesa techniques, is the defined application of emitter or base contacts or conductor paths. This is so effected that a wafer of semiconductor material, e.g. a silicon monocrystal wafer, provided with a plurality of component systems, has the systems thereon completed by vapor deposition using appropriate masks or stencils, with the desired metal, e.g. aluminum or its alloys, silver, gold, platinum, chromium or molybdenum and is thereafter divided into individual components.

If, due to the small geometries, vapor deposition by means of a mask is no longer possible, the metal layer is applied over the whole area and an appropriate photoresist or varnish is applied. The desired structure is produced by exposing and developing the photovarnish after which the metal layer is peeled of from the undesired localities of the semiconductor system. In addition to metal vapor depositing, it is also possible to apply the metallization of a semiconductor surface by cathode sputtering or with the aid of a galvanic solution. These methods require a considerable expenditure in equipment, and furthermore have the disadvantage that the metallizations thus produced are not excellent with respect to their adhesiveness and their layer thickness on the semiconductor surface, thus making the contactability more difficult. This results in mechanical and electrical breakdowns in the thus produced semiconductor circuit components.

It is an object of my invention to improve the adhesiveness and thus the contactability of metallizations comprising aluminum alloys on semiconductor surfaces and at the same time to provide a method which works rationally and does not entail a great deal of apparatus.

I produce a metallization containing an alloy of aluminum with silver of titanium by applying a solution of the respective metal alanate compound, dissolved in an organic varnish which is converted into the pure metal alloy layer through thermal dissociation (thermolysis) in an oxygen and argon atmosphere, at temperatures between 200 and 300° C. and alloyed into the semiconductor surface.

According to the invention, a photosensitive varnish may be used as a varnish solution. It is equally possible however, to use as the varnish solution a nitrocellulose, dissolved in butylacetate/ether. The use of organic varnishes provide particularly homogeneous coating thicknesses over the entire semiconductor surface being coated. This result is uniform metal layers. When photovarnishes or resists are used, very finely detailed metal structures may be produced down to a width of 1/1000 mm., using the known method steps of photo technique with subsequent heating.

The method of the invention may be used to particular advantage for producing titanium or silver containing aluminum contacts, both on free semicontactor crystal surfaces and on those coated with masking or protective layers ($SiO_2$, $Al_2O_3$, $Si_3N_4$). The method is also applicable in the presence of photoresist coatings. The aluminum alloy layers produced according to this method are especially suited for the production of semiconductor components, particularly in planar technique, due to their uniformity of layer thickness and their good electrical conductivity.

The invention will be elucidated further with reference to an embodiment example, as shown in FIGS. 1 to 3 wherein.

Figure 1:
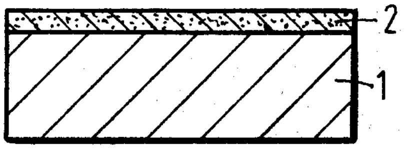
FIG. 1 shows a semiconductor substrate coated with organic varnish solution containing the metal compound.
Figure 2:
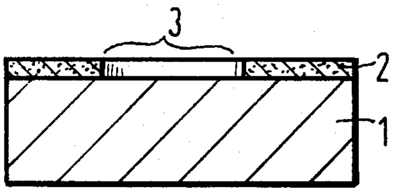
FIG. 2 shows the device following the photo method.
Figure 3:
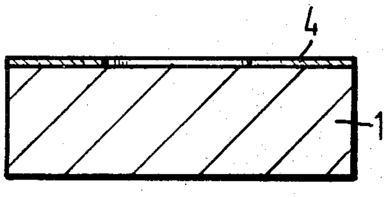
FIG. 3 shows the device following thermolysis.

For the production of a silver containing aluminum layer, a substrate crystal wafer 1, consisting of a silicon semiconductor body, as shown in FIG. 1, was sprayed with a nitrocellulose-ether-butylacetate varnish containing dissolved or suspended therein silver alanate $Ag(AlH_4)$ at a concentration of 5 to 10%. The coated body was centrifuged for 15 seconds at 2000 UpM. This resulted in the varnish film 2 with a layer thickness of approximately 5 μm. After tempering of the varnish film at 100° C., for a maximum of 5 minutes, the substrate surface was freed by the photoetching technique in the region 3, as illustrated in FIG. 2. During the development of the photo varnish, the lower lying metal varnish layer was removed also. The method step is simplified if, rather than nitrocellulose varnish, a photosensitive varnish (resist) is applied directly in the absence of daylight. The thermolysis or thermal dissociation of the silver containing aluminum varnish layer is effected at 200 to 300° C., in an oxygen and argon atmosphere and lasts for about 3 to 10 minutes. The silver containing aluminum layer 4 then forms on the silicon substrate 1. In an analogous manner, titanium-aluminum alloy may be produced by using titanium alanate $Ti(AlH_4)_4$.

The sintering or alloying of aluminum-alloy layers into the semiconductor body is effected in known tubular or continuous furnaces, at temperatures of about 500° C.

The method according to the teaching of the invention makes it possible to obtain reproducible alloys at layer thicknesses between 400 and 2000 A., for conductor paths or for use in beam-lead technology, for example.

What is claimed is:

1. The method of producing a contactable adhesion layer on surfaces of silicon planar and other semiconductor components, which comprises coating a semiconductor body with a solution in an organic varnish of an alanate compound of metal from the group consisting of silver and titanium, thermally dissociating the coating on said semiconductor surface in an oxygen/argon atmosphere at temperatures between 200° and 300° C. to convert the coating into a pure coating of said metal, and alloying the metal into the semiconductor surface, thereby obtaining said contactable adhesion layer.

2. The method according to claim 1, wherein said solvent varnish is photosensitive varnish.

3. The method according to claim 1, wherein said varnish is a solution of nitrocellulose dissolved in a butylacetate/ether mixture.

4. The method according to claim 1, wherein said varnish is nitrocellulose/ether/butylacetate which contains the alanate metal compound in a concentration of 5 to 10%.

5. The method of claim 3, wherein after applying a layer of said metal compound dissolved in nitrocellulose varnish to said semiconductor, a photosensitive varnish is deposited on top of said nitrocellulose varnish layer to permit further fabrication by photoresist technique.

6. The method of claim 1, wherein the concentration of said metal compound in said solution is adjusted to 5 to 10%.

7. The method of claim 1, wherein said metal containing varnish is deposited in a layer thickness of about 5 μm.

8. The method of claim 1, wherein said semiconductor body has an oxide coat upon which said metal containing varnish is deposited.

9. The method of claim 1, wherein said semiconductor body consists of silicon and has a silicon dioxide surface upon which said metal containing varnish is deposited.

References Cited

UNITED STATES PATENTS 3,723,178 3/1973 Sohlbrand .......... 117—217

OTHER REFERENCES

Mueller, et al.: "Metal Hydrides," Academic Press Inc., p. 583, 1968.

MAYER WEINBLATT, Primary Examiner

U.S. Cl. X.R.

117—42 CA, 62.1, 130 R, 160 R, 212; 423—645